United States Patent
Wu (10) Patent No.: US 7,378,889 B2
(45) Date of Patent: May 27, 2008

(54) PULSE WIDTH MODULATION DEVICE WITH A POWER SAVING MODE CONTROLLED BY AN OUTPUT VOLTAGE FEEDBACK HYSTERESIS CIRCUIT

(75) Inventor: Chung-Cheng Wu, Tao Yuan (TW)

(73) Assignee: Niko Semiconductor Co., Ltd., Taipei (TW)

( * ) Notice: Subject to any disclaimer, the term of this patent is extended or adjusted under 35 U.S.C. 154(b) by 18 days.

(21) Appl. No.: 11/282,585

(22) Filed: Nov. 21, 2005

(65) Prior Publication Data

US 2006/0109039 A1 May 25, 2006

(30) Foreign Application Priority Data

Nov. 23, 2004 (TW) ............... 93136061 A (51) Int. Cl.
*H03K 7/08* (2006.01)
(52) U.S. Cl. ...................... 327/176; 327/175
(58) Field of Classification Search ......... 327/172–176
See application file for complete search history.

(56) References Cited

U.S. PATENT DOCUMENTS

| | | | | | |
|---|---|---|---|---|---|
| 5,003,196 | A | * | 3/1991 | Kawaguchi | ................. 327/62 |
| 5,565,761 | A | * | 10/1996 | Hwang | ....................... 323/222 |
| 5,742,151 | A | * | 4/1998 | Hwang | ....................... 323/222 |
| 5,798,635 | A | * | 8/1998 | Hwang et al. | ............. 323/222 |
| 6,320,434 | B1 | * | 11/2001 | Chang et al. | ............... 327/141 |
| 6,429,709 | B1 | * | 8/2002 | Hall et al. | ................. 327/175 |
| 6,657,417 | B1 | * | 12/2003 | Hwang | ....................... 323/222 |
| 6,828,836 | B1 | * | 12/2004 | Barrow et al. | ............. 327/172 |

\* cited by examiner

*Primary Examiner*—N. Drew Richards
*Assistant Examiner*—William Hernandez
(74) *Attorney, Agent, or Firm*—Troxell Law Office, PLLC (57) ABSTRACT

A pulse width modulation device with a power saving mode controlled by an output voltage feedback hysteresis circuit is used in a power supply. The present invention comprises a hysteresis comparison circuit extracting a feedback voltage, a high threshold voltage and a low threshold voltage, and the voltages are executed by a comparison and hysteresis operation to a output blanking signal, a PWM control unit extracting a detecting current signal and the feedback voltage to output a modulation signal after a comparison operation is executed; an OR gate circuit connected to the hysteresis comparison circuit and the PWM control unit for receiving the blanking signal and the modulation signal to output a reset signal; and a synchronization signal output unit connected to the OR gate circuit for receiving the reset signal and an oscillation signal to output the drive signal.

13 Claims, 7 Drawing Sheets

PULSE WIDTH MODULATION DEVICE WITH A POWER SAVING MODE CONTROLLED BY AN OUTPUT VOLTAGE FEEDBACK HYSTERESIS CIRCUIT

BACKGROUND OF THE INVENTION

1. Field of the Invention

This invention relates to a pulse width modulation device with a power saving mode controlled by an output voltage feedback hysteresis circuit. In particular, this invention relates to a pulse width modulation device used in a power supply that controls the output driving signal according to the output load variation.

2. Description of Related Art

In the applications of low power output, such as a charger for a mobile phone, a wireless telephone, a digital still camera and a PDA, and an AC voltage regulator for a printer, a TV game player, and a hand-held Walkman, has great request for power saving in a standby mode.

Figure 1:
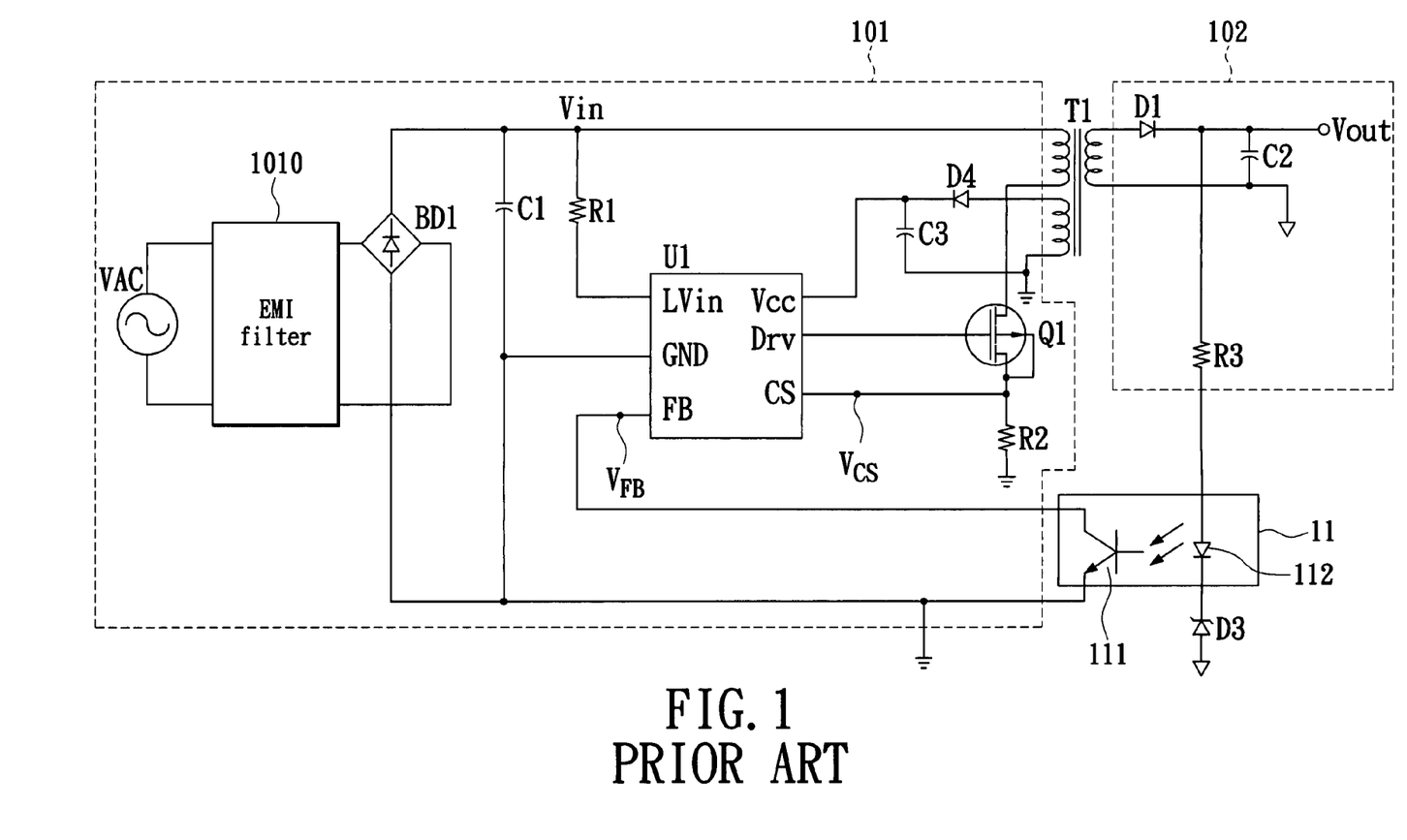
FIG. 1 is a structure diagram of the circuit of a conventional flyback power supply device.

In currently known DC power supply devices, such as an AC-to-DC switching power supply, in order to reduce the volume of a transformer, a high-frequency pulse width modulation PWM is widely used to control a DC output voltage, as shown in FIG. 1, which is a structure diagram of the circuit of a conventional flyback power supply device. The circuit is divided into a pre-stage circuit 101 of primary side and a post-stage circuit 102 of secondary side by a transformer T1. A phototransistor 111 and a photodiode 112 are provided between the primary side 101 and the secondary side 102 to separate an electrical signal at the primary side 101 from that at the secondary side 102. However, an optical signal can be used to feed a voltage or output current variation signal at the secondary side 102 back to the primary side 101 so as to synchronously adjust the variable quantity of voltage or current at the primary side 101 or the secondary side 102. This output signal is also used as a feedback signal for over current or short circuit protection.

Please refer to FIG. 1 again. From the primary side 101, an AC voltage VAC is inputted that passes through an EMI filter 1010, a bridge rectifier BD1, and a high voltage filter capacitor C1 to transform a DC voltage Vin. Through a pulse regulation control unit U1 controls the turn-on period of a power transistor switch Q1, the DC voltage Vin is transmitted to the primary-side winding of transformer T1. In the mean time, the secondary-side winding of transformer T1 induces an output voltage, and after being rectified and filtered by a diode D1 and an electrolysis capacitor C2, the voltage is transformed into a stable DC voltage Vout and outputted.

The outputted DC voltage Vout is transformed into a voltage signal $V_{FB}$ via a feedback voltage regulator D3 and an optical coupler 11, and then fed back to the pulse regulation control unit U1 at the primary side 101. At the same time, when the power transistor switch Q1 turns ON, a detecting current signal Vcs is obtained via a resistor R2 and sent to the control unit U1. The unit U1 gets the signal Vcs and the voltage signal $V_{FB}$ to calculate and output a PWM to the switch Q1 for stabilizing of the outputted DC voltage Vout. The optical coupler 11 is composed of the phototransistor 111 and the photodiode 112.

Figure 2:
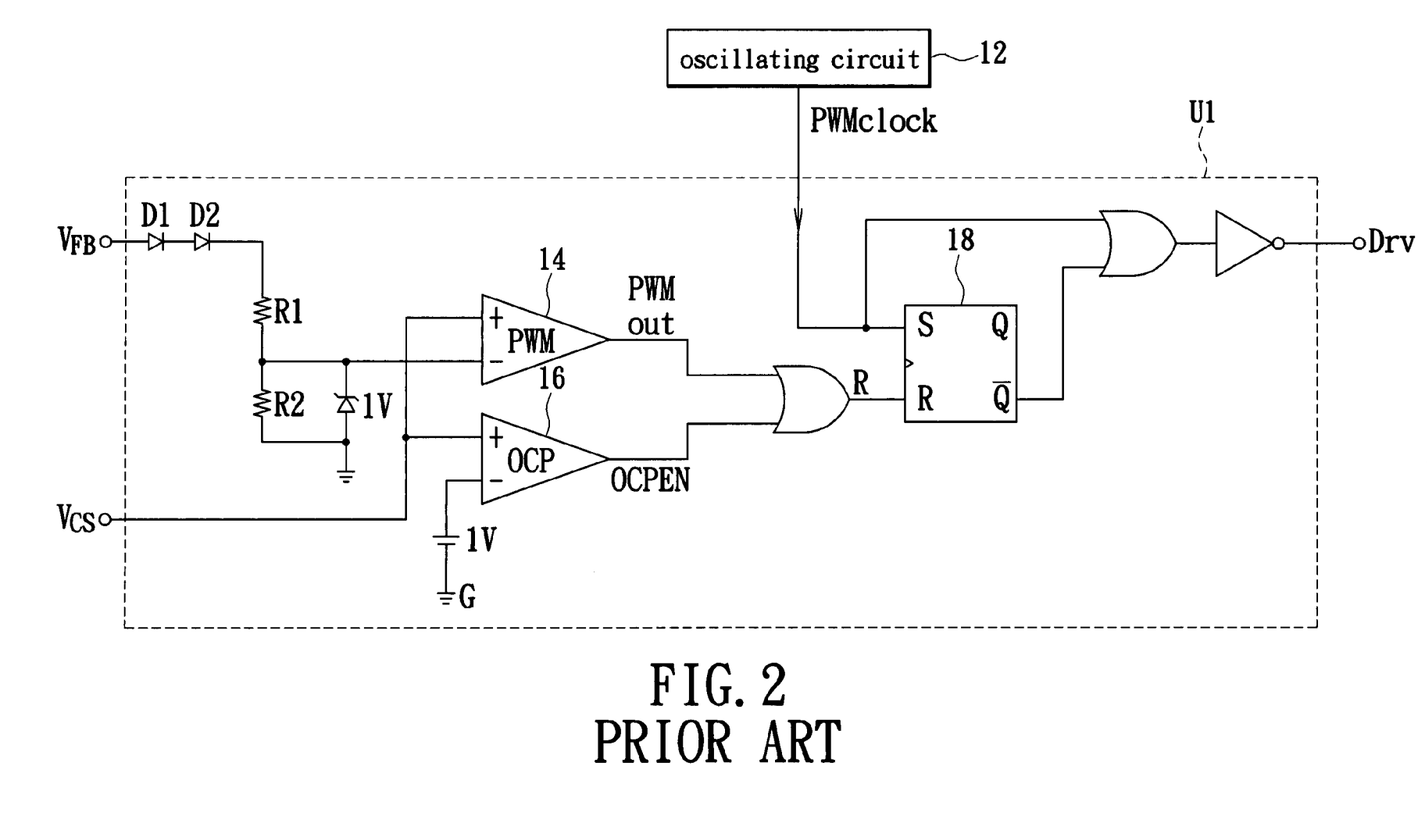
FIG. 2 is a block diagram of the circuit of a conventional pulse width modulation control unit.

Please refer to FIG. 2, which shows a block diagram of the circuit of a conventional pulse width modulation control unit. The pulse width modulation control unit U1 is composed of a PWM comparator 14, an overcurrent comparator 16, a flip-flop 18, and OR gates. The operation method of PWM is described as below. An oscillating circuit 12 provides a fixed frequency clock PWMclock to the pulse regulation control unit U1. Further, the PWM comparator 14 in the pulse regulation control unit U1 detects the voltage signal $V_{FB}$ fed back from the outputted DC voltage Vout and detects the current signal Vcs to compare for outputting a modulation output signal PWMout. The overcurrent comparator 16 further obtains the detecting current signal Vcs and a current limiting level 1V to execute a comparison operation for outputting an over current enable signal OCPEN. After the modulation output signal PWMout and the overcurrent enable signal OCPEN are logically operated via the of OR gates, a reset signal R is outputted to the port R of the flip-flop 18. The port S of flip-flop 18 is connected to an oscillating circuit 12 to obtain a fixed frequency clock PWMclock that is used as an operating frequency, and outputs a drive signal Drv to a power switch (not shown in the figure) after logically operated by OR gates and a NOT gate.

Figure 3:
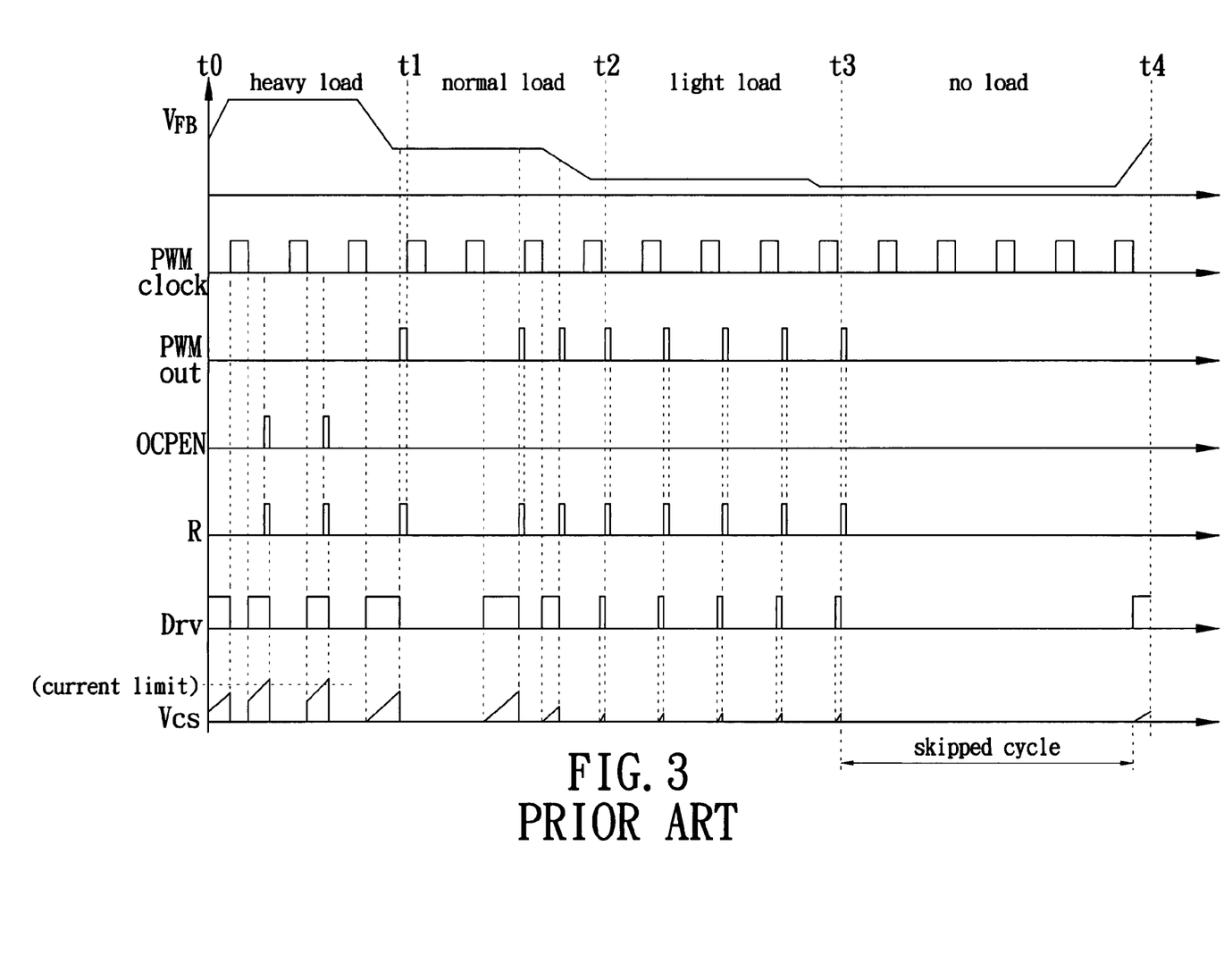
FIG. 3 is a schematic view of the signal waveforms from the conventional pulse width modulation control unit.

Please refer to FIGS. 2 and 3. FIG. 3 shows signal waveforms given from the conventional pulse width modulation control unit. In FIG. 3, the abscissa axis is an axis of time t and the ordinate axis shows all waveforms. During the period of time t0 to t1, the voltage signal $V_{FB}$ is indicate a heavy-load signal, and after the modulation output signal PWMout and the overcurrent enable signal OCPEN are logically operated by of the OR gates, a reset signal R is outputted to make an output pulse width of the drive signal Drv outputted by the flip-flop 18 wider. In other words, the duty cycle of the power switch (not shown in the figure) becomes longer. Thereby, the electric power for the load is provided.

Likewise, during the period of time t1-t2, a normal load exists and the width of pulse of the drive signal Drv outputted by the flip-flop 18 is belonging to a width of the normal power supply. Then, the load becomes lighter during the period of time t2-t3. After the modulation output signal PWMout and the overcurrent enable signal OCPEN are logically operated by the OR gates to output a reset signal R. The reset signal R and the fixed frequency clock PWMclock outputted from the oscillating circuit 12 are calculated by the flip-flop 18, the output pulse width of the drive signal Drv outputted from the flip-flop 18 becomes shorter. Thereby, an electric power for the light load is provided. The operating frequency of the power switch (not shown) driven by the drive signal Drv does not vary with the variation of duty cycle of output pulse. In other words, the operating frequency of the circuit is permanently fixed. Therefore, in the condition of light load, the drive signal Drv constantly generates a pulse with a short duty cycle that depends on the clock PWMclock. Thereby, the power consumption is wasted in the condition of light load. At the period of t3-t4, the circuit is in the condition of no load, and no drive signal Drv is outputted. This period is a skipped cycle.

When an electronic product works in the condition of full load or medium load, it usually controls the switching operation of a switch by PWM. Its working loss includes a conduction loss and a switching loss. However, when the electronic product is in the condition of light load or no load, if the PWM is still used for controlling the switching operation of the switch, the conduction loss decreases due to the electronic product is in the condition of light load. However, because the operating frequency of the switch is constantly fixed, the switching loss does not decrease with the load decreasing. Therefore, in the condition of light load, the operation mode by using the PWM will decease the efficiency of the whole system.

Figure 4:
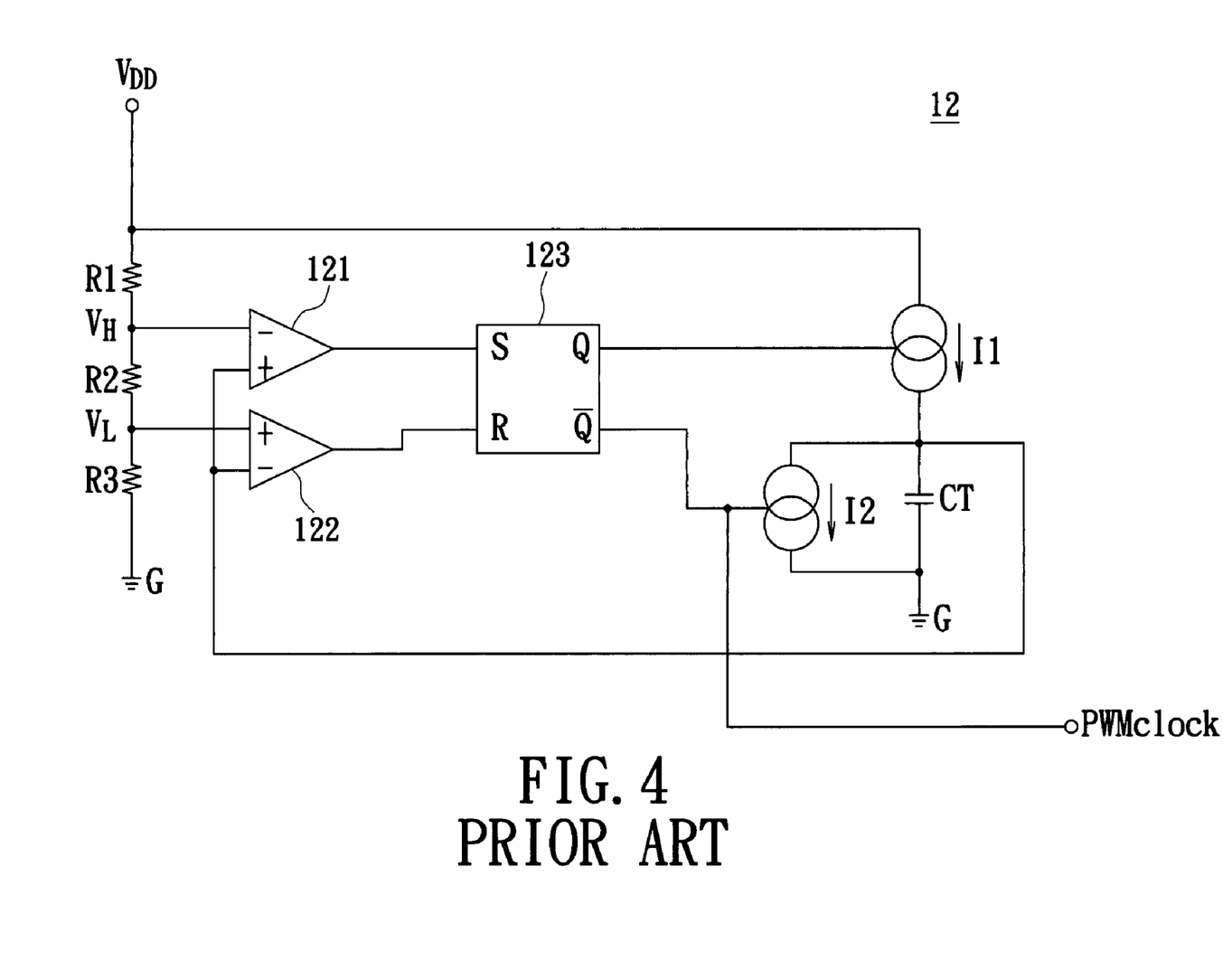
FIG. 4 is a block diagram of a conventional oscillating circuit.

Please refer to FIG. 4, which shows a block diagram of a conventional oscillating circuit. The oscillating circuit 12 utilizes a voltage source VDD to supply the electric power to the voltage-dividing resistors R1, R2, and R3 to provide the set of threshold voltage VH and VL. Then, the comparators 121 and 122 individually obtain the set of threshold voltage VH and VL and compare the charge and discharge signals outputted by a capacitor CT. After being operated, the signals adjust control current sources I1 and I2 via a flip-flop 123 to charge and discharge the capacitor CT. Then, the oscillating circuit 12 generates the clock PWMclock at an output terminal $\overline{Q}$ of the flip-flop 123 to supply a reference frequency for the PWM.

SUMMARY OF THE INVENTION

One particular aspect of the present invention is to provide a pulse width modulation device with a power saving mode controlled by an output voltage feedback hysteresis circuit. It is used in a power supply and is used to control and output a drive signal to a power switch according to the load variation.

In order to achieve the above object, the present invention utilizes a hysteresis comparison circuit to obtain a feedback voltage, a high threshold voltage, and a low threshold voltage. Then, the voltages are compared and hysteresis operated to output a blanking signal. The blanking signal is transmitted to an OR gate connected with the hysteresis comparison circuit. The OR gate is connected to a pulse width modulation control unit to receive a modulation signal and meanwhile receives the modulation signal and the blanking signal. After the modulation signal and the blanking signal are logically operated via the OR gate, a reset signal is outputted. A synchronization signal output unit meanwhile receives the reset signal and an oscillation signal to synchronously output the signals for outputting a drive signal.

From the description above, it is apparent that this invention varies with the light or heavy load to enable or disable the control for the output of drive signal to enable or disable of the switching operation of power switch. Therefore, the power supply can respond well to the operation environment variation to achieve the effects, such as a better efficiency or a stable output for saving the power.

For further understanding of the invention, reference is made to the following detailed description illustrating the embodiments and examples of the invention. The description is only for illustrating the invention and is not intended to be considered limiting of the scope of the claim.

DETAILED DESCRIPTION OF THE PREFERRED EMBODIMENTS

Figure 5:
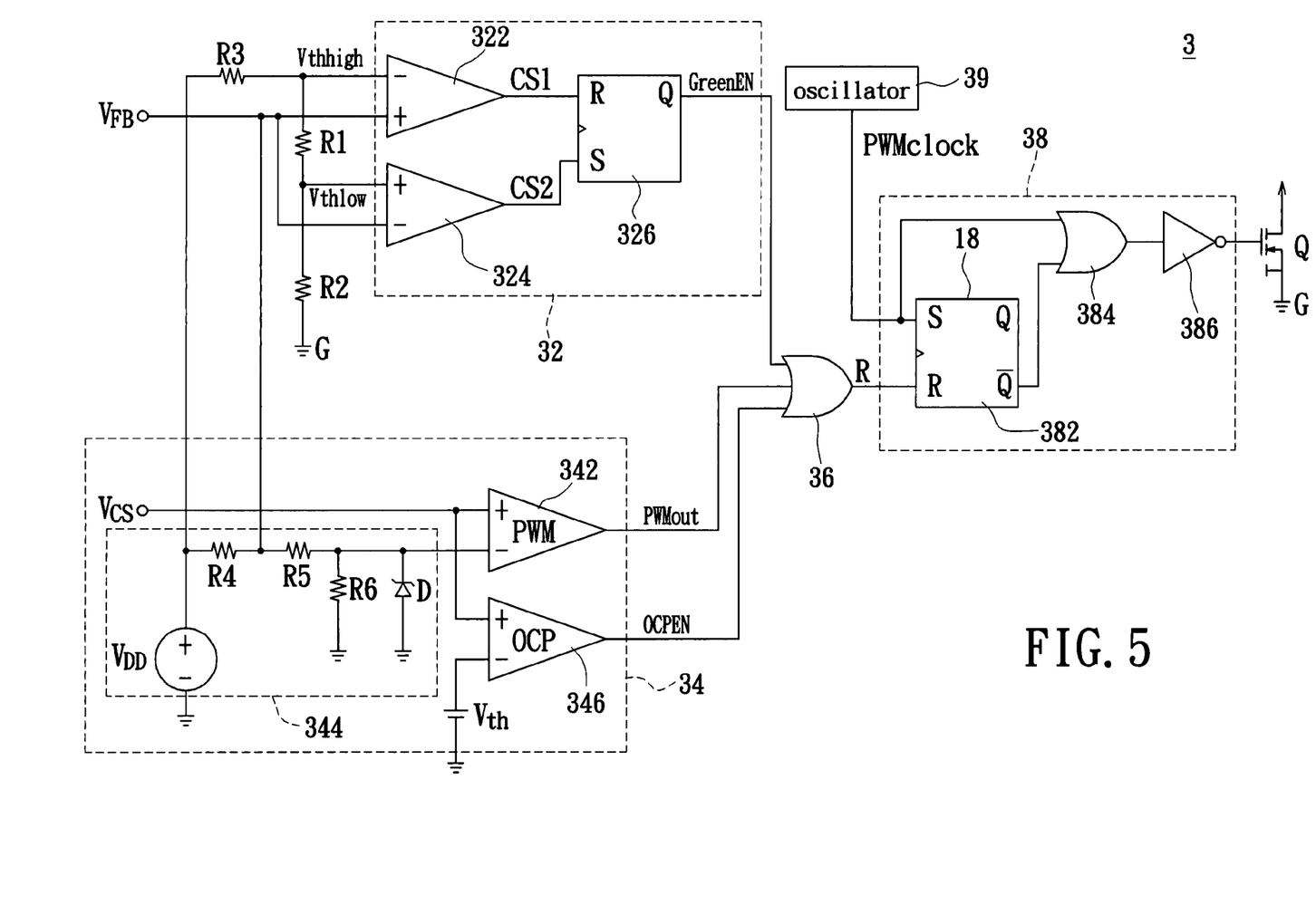
FIG. 5 is a schematic view of the circuit of the present invention.

Please refer to FIG. 5, which shows a schematic view of the circuit of the present invention. A pulse width modulation device 3 of the present invention controls and outputs a drive signal DRV to a power switch Q according to the load variation of a power supply. The pulse width modulation device 3 includes a hysteresis comparison circuit 32, a pulse width modulation control unit 34, a OR gate circuit 36 and a synchronization signal output unit 38.

Please refer to FIG. 5 again. The pulse width modulation device 3 of the present invention receives a feedback voltage $V_{FB}$ from a load terminal of the power supply and uses a DC power supply VDD to send the electric power to a first resistor R1 and a second resistor R2 that are connected in series via a resistor R3. Then, the voltage of the electric power is divided into a high threshold voltage Vthhigh and a low threshold voltage Vthlow via the two resistors R1 and R2.

Further, the hysteresis comparison circuit 32 extracts the feedback voltage $V_{FB}$, the high threshold voltage Vthhigh and the low threshold voltage Vthlow. Then, after the above voltages are operated by a comparison and hysteresis operation, a blanking signal GreenEN is outputted. The blanking signal GreenEN is transmitted to the OR gate 36 connected with the hysteresis comparison circuit 32. The hysteresis comparison circuit 32 includes a first comparator 322 receiving the high threshold voltage Vthhigh and the feedback voltage $V_{FB}$ to compare and output a first comparison signal CS1, a second comparator 324 receiving the low threshold voltage Vthlow and the feedback voltage $V_{FB}$ to compare and output a second comparison signal CS2, a flip-flop 326 connected to the first comparator 322 and the second comparator 324 for receiving the first comparison signal CS1 and the second comparison signal CS2 to compare and output the blanking signal GreenEN.

From the description above, a positive input terminal (+) of the first comparator 322 is connected to the load terminal of the power supply to receive the feedback voltage $V_{FB}$, and an inverse input terminal (−) of the first comparator 322 is connected to a DC power supply VDD via a resistor R3 to receive the high threshold voltage Vthhigh. An inverse input terminal (−) of the second comparator 324 is connected to the load terminal of the power supply to receive the feedback voltage $V_{FB}$, and a positive terminal (+) is connected to a DC power supply VDD via a first resistor R1 and then the resistor R3 and connected to a reference ground G via a second resistor R2 to receive the low threshold voltage Vthlow. The flip-flop 326 is a RS flip-flop. A reset terminal (R) of the flip-flop 326 is connected to an output terminal of the first comparator 322 and a setting terminal (S) is connected to an output terminal of the second comparator 324.

In the mean time, the pulse width modulation control unit 34 is composed of a PWM comparator 342, a voltage divider 344, and an overcurrent comparator 346 that are connected together. The PWM comparator 342 extracts the detecting current signal $V_{CS}$, and the feedback voltage $V_{FB}$ from the voltage divider 344 to output a modulation signal PWMout after comparison operation. The overcurrent comparator 346 extracts the detecting current signal $V_{CS}$ and an overcurrent-limited potential Vth and then outputs an overcurrent enable signal OCPEN after comparison operation. From the description above, the divider 344 is composed of the resistors R4, R5, and R6, a DC power supply and a voltage regulation unit. It is used to lower the level of the feedback voltage $V_{FB}$ to compare with the detecting current signal $V_{CS}$.

Reference is made to FIG. 5 again. The OR gate circuit 36 is connected to the hysteresis comparison circuit 32 and the pulse width modulation control unit 34, it's used to receive the blanking signal GreenEN, the modulation signal PWMout, and the overcurrent enable signal OCPEN for outputting a reset signal R.

The synchronization signal output unit 38 is composed of a RS flip-flop 382, an OR gate unit 384, and a NOT gate unit. A setting terminal of the RS flip-flop 382 is connected to an oscillator 39 to receive the oscillation signal PWMclock, and a reset terminal of the RS flip-flop 382 is connected to the OR gate 36 to receive the reset signal R, and the drive signal DRV is outputted from the OR gate unit 384 and the NOT gate unit 386 to a control terminal of the power switch Q.

Figure 6:
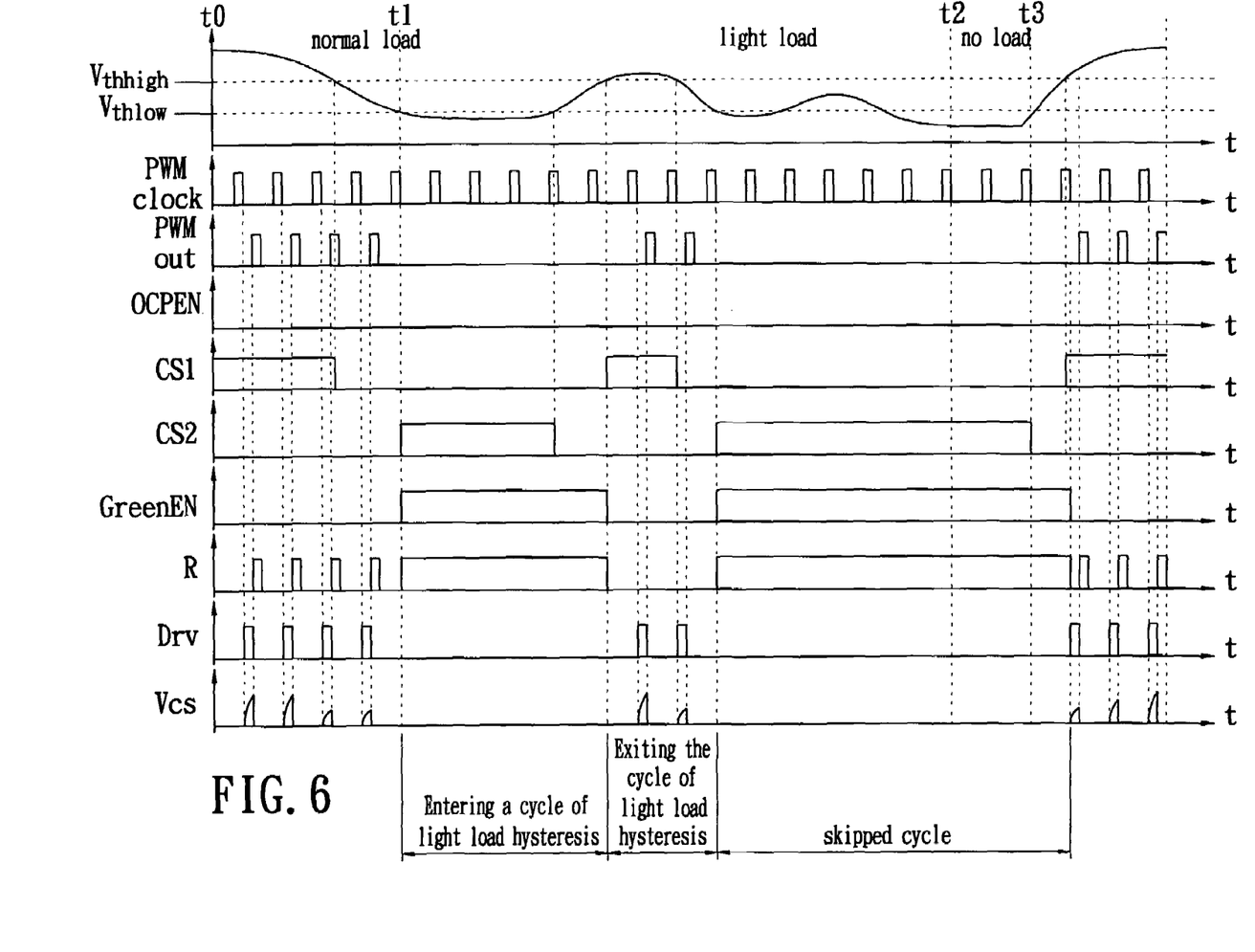
FIG. 6 is a schematic view of the waveforms given from the circuit of the present invention.

Please refer to FIGS. 5 and 6. FIG. 6 shows the waveforms of the circuit of this invention. As shown in FIG. 6, the ordinate axis is an axis of voltage (V) and an abscissa axis is an axis of time (t). During the period of time t0 to t1, the voltage signal $V_{FB}$ is in the condition of normal load. After the current enable signal OCPEN, the modulation output signal PWMout, and the blanking signal GreenEN are logically operated by the OR gate circuit 36, a reset signal R is outputted to make the drive signal Drv outputted by the synchronization signal output unit 38 drive the power switch Q for providing electric power for the load.

During the period of time t1-t2, the load is light and then the feedback voltage signal $V_{FB}$ up and down oscillates between the high threshold voltage Vthhigh and the low threshold voltage Vthlow. The feedback voltage signal $V_{FB}$ is compared by a hysteresis comparator 32 with the high threshold voltage Vthhigh and the low threshold voltage Vthlow individually to output the first comparison signal CS1 and the second comparison signal CS2, respectively. After the first comparison signal CS1 and the second comparison signal CS2 are operated by the RS flip-flop 326 to output the blanking signal GreenEN. After the blanking signal GreenEN, the current enable signal OCPEN and the modulation output signal PWMout are logically operated by the OR gate 36 to output the reset signal R.

During the period of time t1-t2, the pulse width modulation device 3 of the present invention in the condition of light load enters a cycle of light load hysteresis due to the effect produced by the hysteresis circuit 32. At this moment, almost no drive signal DRV is outputted. Then, if the feedback voltage $V_{FB}$ exceeds the high threshold voltage Vthhigh, a transient drive signal DRV is outputted. At this period, it is a cycle exiting from the range of light load hysteresis and almost no output loss occurs in the condition of light load. Thereby, a goal of saving the power is achieved. Further, the period of t2-t3 is in the condition of no load. At this time the feedback voltage $V_{FB}$ is lower than the low threshold voltage Vthlow. Therefore, the level of blanking signal GreenEN produced by operating the first comparison signal CS1 and the second comparison signal CS2 via the RS flip-flop 326 is high and thus the level of reset signal R is also high. The output of drive signal DRV is stopped for saving the power. In the description above, the period is a skipped cycle.

Figure 7:
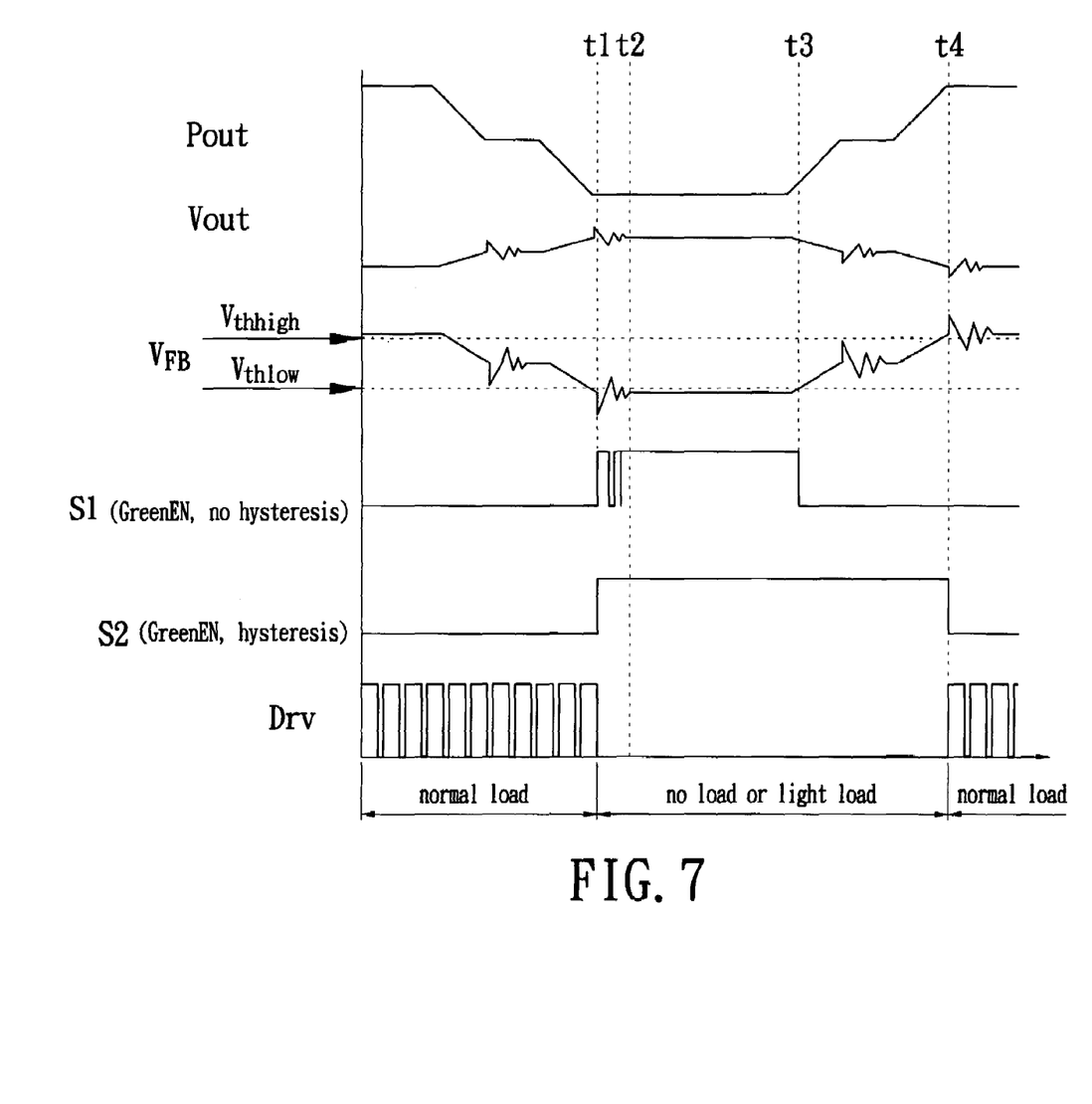
FIG. 7 is a schematic view of the waveforms with respect to an output power, a feedback voltage, a reset signal, and a drive signal in the condition of hyteresis or no hyteresis according to this invention.

Refer to FIG. 7, which shows waveforms with respect to an output power, a feedback voltage, a reset signal, and a drive signal in the condition of hyteresis or no hyteresis according to this invention. During the period of t1-t2, when the load of output power Pout varies, the output voltage Vout is affected. Therefore, the feedback voltage $V_{FB}$ generates noises that influence the output of waveforms of the blanking signal GreenEN. During the period of t1-t2, if no hyteresis designs in the circuit, the output of the blanking signal GreenEN is a waveform S1. Because the variation of load make the blanking signal GreenEN be unstable, the drive signal DRV is still outputted at the condition of light load or no load. Therefore, some problems are produced, such as the power loss of circuit, low operation efficiency, and unstable output voltage. If hyteresis designs in the circuit, a stable blanking signal GreenEN is produced and it is the waveform S2 in the figure. At this time the output of blanking signal GreenEN is stable at a high level to prevent noises from being interfered. Therefore, the drive signal DRV stops outputted in the condition of light load or no load. A power saving effect and a stable output voltage are achieved.

Next, during the period of time t3-t4, when the load of output power Pout varies, the output voltage Vout is affected. Similarly, the feedback voltage $V_{FB}$ generates noises as interference that influences the output of waveform of the blanking signal GreenEN. If no hyteresis designs in the circuit, the reset signal R enters the low level at the condition of light load or no load to make the drive signal start to output. Therefore, the problems are produced, such as the power loss of circuit, low work efficiency, and unstable output voltage. If hyteresis designs in the circuit, the blanking signal GreenEN in this period delays for a hyteresis period and then enters the low level to output the drive signal DRV and then to prevent noises from interfering.

The present invention utilizes a hysteresis comparison circuit to extract the feedback voltage, the high threshold voltage, and the low threshold voltage. Then, the extracted voltage is compared. After the comparison operation and the hysteresis operation, it outputs a blanking signal. The blanking signal is sent to an OR gate that is connected to the hysteresis comparison circuit and the OR gate is connected to a pulse width modulation control unit to receive a modulation signal. The OR gate receives the modulation signal and the blanking signal and outputs a reset signal after the OR gate executes a logic operation. A synchronization signal output unit receives the reset signal and an oscillation signal to synchronously output the signals for outputting a drive signal.

This invention varies with the light or heavy load to filter the unnecessary switching operations via the operation of the hysteresis circuit for enabling or disabling the control of the output of drive signal to enable or disable of the switching operation of power switch. Therefore, the power supply can response well with the variation of the operation environment to achieve the effect of saving the power with a better efficiency or a stable output.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. A pulse width modulation device with a power saving mode controlled by an output voltage feedback hysteresis circuit, used in a power supply and varying with the load of the power supply to control and output a drive signal transmitted to a power switch, comprising:

a hysteresis comparison circuit extracting a feedback voltage, a high threshold voltage and a low threshold voltage; wherein the feedback voltage, the high threshold voltage and the low threshold voltage are executed a comparison and hysteresis operation to output a blanking signal;

a pulse width modulation control unit extracting a detecting current signal and the feedback voltage to output a modulation signal after a comparison operation is executed which the detecting current signal varies with the current value passing through the power switch;

an OR gate connected to the hysteresis comparison circuit and the pulse width modulation control unit for receiving the blanking signal and the modulation signal to output a reset signal; and a synchronization signal output unit connected to the OR gate for receiving the reset signal and an oscillation signal to output the drive signal.

2. The pulse width modulation device with a power saving mode controlled by an output voltage feedback hysteresis circuit according to claim 1, wherein the hysteresis comparison circuit comprises:

a first comparator receiving the high threshold voltage and the feedback voltage to compare and output a first comparison signal;

a second comparator receiving the low threshold voltage and the feedback voltage to compare and output a second comparison signal; and a flip-flop connected to the first comparator and the second comparator to receive the first comparison signal and the second comparison signal to operate and output the blanking signal.

3. The pulse width modulation device with a power saving mode controlled by an output voltage feedback hysteresis comparison circuit according to claim 2, wherein a positive input terminal of the first comparator is connected to the load terminal of the power supply for receiving the feedback voltage, and an inverse input terminal is connected to a DC power supply for receiving the high threshold voltage.

4. The pulse width modulation device with a power saving mode controlled by an output voltage feedback hysteresis comparison circuit according to claim 2, wherein an inverse input terminal of the second comparator is connected to the load terminal of the power supply for receiving the feedback voltage, and a positive terminal is connected to a DC power supply via a first resistor and to a reference ground via a second resistor.

5. The pulse width modulation device with a power saving mode controlled by an output voltage feedback hysteresis circuit according to claim 2, wherein the flip-flop is a RS flip-flop; wherein a reset terminal of the flip-flop is connected to an output terminal of the first comparator and a setting terminal of the flip-flop is connected to an output terminal of the second comparator.

6. The pulse width modulation device with a power saving mode controlled by an output voltage feedback hysteresis circuit according to claim 1, wherein the pulse width modulation control unit is composed of a PWM comparator, a voltage divider, and an overcurrent comparator; wherein the PWM comparator extracts the detecting current signal and extracts the feedback voltage from the voltage divider to output the modulation signal after a comparison operation is executed.

7. The pulse width modulation device with a power saving mode controlled by an output voltage feedback hysteresis circuit according to claim 6, wherein the overcurrent comparator extracts the detecting current signal and an overcurrent-limited potential to output an overcurrent enable signal to the OR gate circuit after a comparison operation is executed.

8. The pulse width modulation device with a power saving mode controlled by an output voltage feedback hysteresis circuit according to claim 1, wherein the synchronization signal output unit is composed of a RS flip-flop, an OR gate unit and a NOT gate unit; wherein a setting terminal of the RS flip-flop is connected to an oscillator for receiving the oscillation signal and a reset terminal is connected to the OR gate circuit for receiving the reset signal, and the drive signal is synchronously outputted via the OR gate unit and the NOT gate unit.

9. A pulse width modulation device with a power saving mode, comprising:

a hysteresis comparison circuit, receiving a detecting voltage signal, a high threshold voltage and a low threshold voltage and executing a comparison and hysteresis operation accordingly to output a blanking signal;

a pulse width modulation control unit, receiving a detecting current signal and the detecting voltage signal and executing a comparison operation accordingly to output a modulation signal; and an output unit, receiving the blanking signal, the modulation signal and an oscillation signal and outputting a drive signal;

wherein when the detecting voltage signal becomes below the low threshold voltage, the output unit stops to output the drive signal; and when detecting voltage signal becomes above the high threshold voltage, the output unit resumes outputting the drive signal.

10. A pulse width modulation device with a power saving mode according to claim 9, wherein the pulse width modulation control unit further outputs an overcurrent signal when the detecting current signal is above a preset level to stopping the output unit outputting the drive signal.

11. A pulse width modulation device with a power saving mode according to claim 10, wherein the output unit comprises:

an OR gate coupled to the hysteresis comparison circuit and the pulse width modulation control unit for receiving the blanking signal and the modulation signal to output a reset signal; and a synchronization signal output unit connected to the OR gate for receiving the reset signal and the oscillation signal to output the drive signal.

12. A pulse width modulation device with a power saving mode according to claim 11, wherein the synchronization signal output unit comprises:

an RS flip-flop having a setting terminal receiving the oscillation signal and a reset terminal receiving the reset signal;

an OR gate unit receiving the oscillation signal and a signal outputted from the RS flip-flop to output a driving signal; and a NOT gate unit connected to the OR gate unit, outputting the drive signal by inverting the driving signal.

13. A pulse width modulation device with a power saving mode according to claim 9, wherein the output unit outputs the drive signal to a power switch and the detecting current signal varies with the current value passing through the power switch.

* * * * *